United States Patent [19]

Ishikawa et al.

[11] Patent Number: 4,833,508
[45] Date of Patent: May 23, 1989

[54] HIGH ELECTRON MOBILITY DEVICE WITH INTRINSIC ALAS/GAAS SUPERLATTICE SEPARATOR REGION

[75] Inventors: Tomonori Ishikawa, Odawara; Shigehiko Sasa, Isehara; Satoshi Hiyamizu, Kawasaki, all of Japan

[73] Assignee: Fujitsu Limited, Kawasaki, Japan

[21] Appl. No.: 131,232

[22] Filed: Dec. 7, 1987

Related U.S. Application Data

[63] Continuation of Ser. No. 833,270, Feb. 27, 1986, abandoned.

[30] Foreign Application Priority Data

Feb. 28, 1985 [JP] Japan ............................. 60-37433

[51] Int. Cl.$^4$ .......................................... H01L 27/12
[52] U.S. Cl. ........................................ 357/4; 357/22; 357/58; 357/16; 357/91
[58] Field of Search ................. 357/4, 18, 22, 22 M, 357/58, 91

[56] References Cited

U.S. PATENT DOCUMENTS

| | | | |
|---|---|---|---|
| 4,194,935 | 3/1980 | Dingle et al. | 357/22 |
| 4,205,329 | 5/1980 | Dingle et al. | 357/4 |
| 4,410,902 | 10/1983 | Malik | 357/58 |
| 4,695,857 | 9/1987 | Baba et al. | 357/4 |

FOREIGN PATENT DOCUMENTS

| | | |
|---|---|---|
| 133342 | 2/1985 | European Pat. Off. . |
| 183146 | 6/1986 | European Pat. Off. . |
| 60-28273 | 2/1985 | Japan ............... 357/22 |
| 61-271874 | 12/1986 | Japan . |

OTHER PUBLICATIONS

V. Keramides, "Ohmic Contacts to $Ga_{1-x}Al_xAs$," Inst. Phys. Conf. Ser. No. 45: Ch. 5 © 1979, The Institute of Physics, pp. 396–410.
Wood et al., Journal of Applied Physics, vol. 51, No. 1, Jan. 1980, pp. 383–387.
Ploog et al., Journal of the Electrochemical Society, vol. 128, No. 2, Feb. 1981 pp. 400–410.
Miller, Thin Solid Films, vol. 118, No. 2, Aug. 1984, pp. 117–127.
Hikosaka et al. Japanese Journal of Applied Physics, vol. 20, No. 11, Nov. 1981, pp. L847–L850.
Baba et al. Japanese Journal of Applied Physics vol. 22, No. 10, Oct. 1983, pp. L627–L629.
T. Ishikawa et al, "The Electrical Effect of AlGaAs . . .," Jap. J.A.P. Supplement, 16th Int. Conf. Solid–State Devices & Materials (1984).
Kobe, Aug. 30–Sep. 1, Tokyo, Japan, pp. 603–606.
C. Chen et al., "Depletion Mode Modulation Doped . . .," IEEE Electron Device Letters, vol. EDL-3 (1982) #6, pp. 152–155.
NE Report "Superlattice Technique Increasing Electron Density of AlGaAs", Nikkei Electronics, Jul. 16, 1984, pp. 105–108.
H. Lee et al, "Optimized GaAs/(Al,Ga)As Modulation Doped Heterostructures", at Int. Symp. GaAs and Related Compounds, Biarritz, 1984, pp. 321–326.
Patent Abstracts of Japan, vol. 11, No. 127 (E501) [2574], Apr. 21, 1987.

*Primary Examiner*—Joseph E. Clawson, Jr.
*Attorney, Agent, or Firm*—Staas & Halsey

[57] ABSTRACT

A field effect semiconductor device which utilizes a 2DEG and is composed of a semi-insulating GaAs substrate; an i-type GaAs active layer; a superlattice structure layer which comprises a first i-type AlAs thin layer, a GaAs thin layer doped with an Si atomic plane, and a second i-type AlAs thin layer, these thin layers forming a GaAs quantum well; and n-type AlGaAs layer; and electrodes for source, drain, and gate.

5 Claims, 2 Drawing Sheets

HIGH ELECTRON MOBILITY DEVICE WITH INTRINSIC ALAS/GAAS SUPERLATTICE SEPARATOR REGION

This is a continuation of co-pending application Ser. No. 833,270, filed on Feb. 27, 1986, abandoned.

BACKGROUND OF THE INVENTION

1. Field of the Invention

The present invention relates to a field effect semiconductor device, move particularly to a gallium arsenide (GaAs) field effect transistor (FET) utilizing a two-dimensional electron gas (2DEG).

2. Description of the Related Art

A semiconductor device as mentioned above is known as, e.g., a high electron mobility transistor (HEMT) (cf. e.g., T. Mimura, S. Hiyamizu and T. Hikosaka, "Enhancement-Mode High Electron Mobility Transistors for Logic Applications", Japan. J. Apply. Phys., Vol. 20, No. 5, May; 1981, pp.L317-319). The HEMT comprises a semi-insulating GaAs substrate, an undoped (i-type) GaAs active layer, an n-type AlGaAs electron supply layer, an n-type GaAs ohmic contact layer, a source electrode, a drain electrode, and a gate electrode, e.g., as shown in FIG. 1 of the above-mentioned paper. The GaAs active layer, AlGaAs layer, and GaAs contact layer are successively grown on the GaAs substrate by a molecular beam epitaxy (MBE) process. The 2DEG accumulates at the heterojunction interface between the GaAs active layer and the AlGaAs layer, so that a 2DEG layer is formed in the top portion of the GaAs active layer. The source electrode and drain electrode are formed on the GaAs contact layer, and the gate electrode is formed on the AlGaAs layer and is located between the source and drain electrodes. In the HEMT, the 2DEG layer serves as a channel of an FET and is controlled by a voltage applied to the gate electrode.

The HEMT can be provided with an i-type AlGaAs spacer layer between the GaAs active layer and the n-type AlGaAs electron supply layer, e.g., as shown in FIG. 1 of a paper of, S. Hiyamizu, T. Mimura and structures and Their Application to High Electron Mobility Transistors", Proc. 13th Conf. on Solid State Device (1981); Japan. J. Apply. Phys., Vol. 20 (1982), Supplement 21-1, pp. 161-168. The formation of the i-type AlGaAs spacer is intended to separate ionized donor impurities from the n-type AlGaAs layer and the electrons forming the 2DEG layer. In this case, Coulomb scattering of the electrons due to the ionized impurities can be remarkably decreased, and thus a very high electron mobility of the 2DEG can be attained. Such an effect is obtained at a room temperature, but is remarkably obtained at a low temperature at which the scattering of electrons is mainly caused by the ionized donor impurities.

In order to improve the performance of a field effect semiconductor device including the HEMT, an increase of the electron concentration of a 2DEG layer is required.

The electron concentration of the 2DEG layer depends on electrons which are transferred from a donor in the n-type AlGaAs electron supply layer to the i-type GaAs active layer, by virtue of a difference between the electron affinity of GaAs and that of AlGaAs. In order to improve the electron concentration, it is preferable to increase the amount of donor impurities doped into the AlGaAs layer. The doping of donor impurities (e.g., Si) into the layer is performed by simultaneously supplying an As molecular beam, a Ga molecular beam, an Al molecular beam, and an Si molecular beam, in an MBE apparatus. In this method, however, the maximum donor concentration of $Al_xGa_{1-x}As$ (x=0.3) is restricted to the value of $2\times10^{18}$ cm$^{-3}$. Accordingly, the maximum electron concentration of the 2DEG layer of only about $1\times10^{12}$ cm$^{-2}$ can be attained. Such an electron concentration is insufficient for obtaining a large electric current output, so that a transconductance $g_m$ thereof is small. For example, where the semiconductor devices are used in a memory device, charging or discharging a load capacity takes a certain time, so that an operating speed of a memory device system is limited.

Recently, to improve an electron concentration corresponding to the donor concentration of the AlGaAs layer, the adoption of a superlattice technique was proposed. In this case, it is considered that, when AlGaAs is doped with Si, the donor level deepens with the result that the electron concentration of AlGaAs is not sufficiently increased due to the interaction of Al atoms and Si atoms. A superlattice multilayer structure comprising Si doped GaAs thin layers and undoped AlAs thin layers, wherein the Si atoms are kept separate from the Al atoms, is formed by an MBE process so as to correspond equivalently to the AlGaAs structure. As the result, the electron concentration of AlGaAs is increased by one order of magnitude (cf. T. Baba et al, "Elimination of Pensistent Photoconductivity and Improvement in Si Activation Coefficient by Al Spatial Separation from Ga and Si in Al-Ba-As:Si Solid System", Japan. J. Apply. Phys., Vol. 22(1983), pp.L627-L629 and NE Report "Superlattice Technique Increasing Electron Density of AlGaAs", NIKKEI ELECTRONICS, July 16, 1984, pp. 105-108).

Therefore, where the AlGaAs electron supply layer of the field effect semiconductor device is formed by using the above-mentioned superlattice technique, the electron concentration of the 2DEG layer is increased.

According to another proposed adoption of the superlattice technique, in Japanese Unexamined Patent Publication (Kokai) No. 60-28273, published on Feb. 13, 1985, an n-type AlGaAs electron supply layer of an FET utilizing 2DEG is replaced with a superlattice multilayer structure of undoped AlAs thin layers and Si doped GaAs thin layers, which AlAs layers and GaAs layers are alternately grown by an MBE process.

In these proposals for the adoption of the superlattice technique, the formation of an Si doped AlGaAs thin layer is carried out by a conventional MBE process in which an As molecular beam, a Ga molecular beam, and an Si molecular beam impinge simultaneously on a grown AlAs thin layer. However, in this conventional MBE process, the increase of a donor impurity (i.e., dopant) concentration is limited to a certain extent. Thus, in an doped GaAs thin layer of a quantum well, electrons generated from the donors and being at the quantum level are insufficient. Therefore, these proposals adopt a multiquantum well structure so as to increase the electrons for a 2DEG layer. If a doped GaAS thin layer of a quantum well is thickened (i.e., the quantum well width is increased), a quantum level of the electrons in the quantum well is decreased with result that a sheet electron concentration of a 2DEG layer is not sufficiently increased.

On the other hand, another attempt has been made to apply an Si atomic plane doping process for a doped AlGaAs layer formed on an undoped GaAs layer, in H. Lee et al, "Optimized GaAs/(Al,Ga)As modulation doped heterostructures", at Int. Symp. GaAs and Related Compounds, Biarritz, 1984, pp. 321-326. In this case, the doped AlGaAs layer is replaced with an undoped AlGaAs layer incorporating an Si atomic plane, so as to decrease the thickness of an AlGaAs layer between a gate and a 2DEG layer. The atomic plane doping technique can dope impurities to a larger amount than that of a conventional doping carried out during the MBE growth of AlGaAs. However, the above attempt does not adopt a superlattice structure.

SUMMARY OF THE INVENTION

An object of the present invention is to improve a donor impurity (doping) concentration in an n-type electron supply layer of a field effect semiconductor device using a 2DEG, and thus to improve a 2DEG concentration, thereby enhancing the transconductance thereof and obtaining a larger electric current output.

Another object of the present invention is to adopt a superlattice structure for the electron supply layer, which structure is simpler than the above-mentioned proposed superlattice structure.

Still another object of the present invention is to reduce a resistance between a source or drain electrode and a 2DEG layer.

The above and other objects of the present invention are attained by providing a field effect semiconductor device utilizing a 2DEG, which device is composed of a semi-insulating substrate, an i-type active layer formed on the substrate, a superlattice structure layer formed on the i-type active layer, and electrodes for source, drain, and gate. The superlattice structure layer on the GaAs active layer comprises a first i-type thin layer on the active layer, a thin well layer doped with dopant by an atomic plane doping process and formed on the first thin layer, and a second i-type thin layer formed on the doped thin well layer, these thin layers forming a quantum well.

It is preferable that the superlattice structure layer consists of the first and second i-type thin layer and the doped thin well layer, and that a doped layer is formed on the superlattice structure layer.

The adoption of a superlattice structure layer forming a quantum well and an atomic plane doping process increases a concentration of electron being at a quantum level, so that a sheet electron concentration of a 2DEG layer.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figures 1, 2:
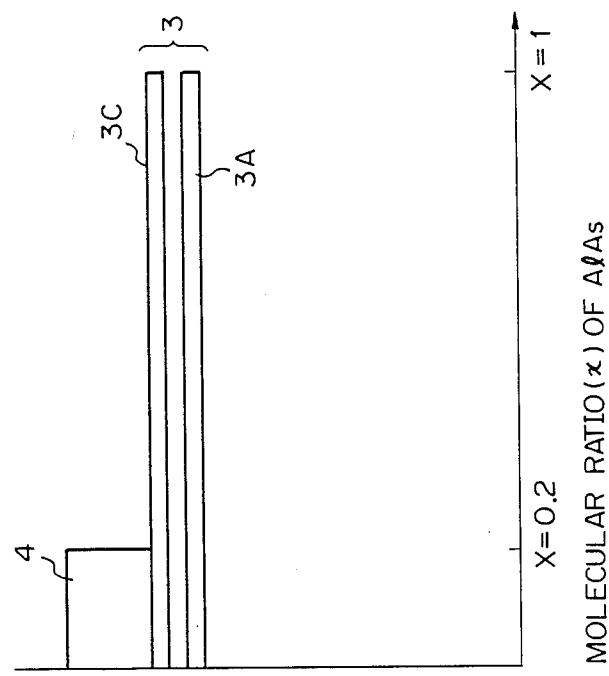
FIG. 1 is a schematic sectional view of a field effect semiconductor device utilizing a 2DEG according to the present invention.
FIG. 2 is a diagram showing a molecular ratio (x) of AlAs in the semiconductor device of FIG. 1.

Referring to FIG. 1, a field effect semiconductor device comprises a semi-insulating GaAs substrate 1, an i-type (undoped) GaAs active layer 2, a superlattice structure layer 3, an n-type AlGaAs layer 4, an n-type GaAs contact layer 5, a source electrode 6, a drain electrode 7, and a gate electrode 8. A 2DEG layer 9 is generated in the top portion of the GaAs active layer 2 at the interface of a heterojunction formed by the GaAs active layer 2 and the superlattice structure layer 3.

According to the present invention, the superlattice structure layer 3 comprises an i-type AlAs thin layer 3A, a GaAs thin layer 3B doped with donor (e.g., Si) by an atomic plane doping process, and an i-type AlAs thin layer 3C. These thin layers 3A, 3B, and 3C form a GaAs quantum well. In the GaAs thin layer 3B a dopant (Si) atomic plane 10 is formed. In this case, the super-lattice structure layer 3 and the n-type AlGaAs layer 4 serve as an electron supply layer.

The semiconductor device is produced in the following manner.

A (100) oriented semi-insulating GaAs substrate 1, a Ga effusion cell, an As effusion cell, an Al effusion cell, and an Si effusion cell are set in an MBE apparatus. The effusion cells are provided with shutters intercepting molecular beams from the effusion cells, respectively. The MBE apparatus is evacuated to a high vacuum, and the substrate 1 and the effusion cells are heated at prescribed temperatures, respectively.

The shutters of the As effusion cell and the Ga effusion cell are opened to allow an As molecular beam and a Ga molecular beam to impinge on the GaAs substrate, so that an undoped GaAs layer 2 (having a thickness of, e.g., 0.5 $\mu$m) is formed. The shutter of the As effusion cell is operated to continue the supplying of the As molecular beam (i.e., As atoms) until the end of an MBE growth, to prevent the surface of the grown layers from being degraded.

Next, the shutter of the Ga effusion cell is closed and the shutter of the Al effusion cell is opened to bombard the GaAs layer 2 with an Al molecular beam together with the As molecular beam, so that an undoped AlAs thin layer 3A (having a thickness of from 1 to 10 nm) is formed. Then, the shutter of the Al effusion cell is closed and the shutter of the Ga effusion cell is reopened so as to grow an undoped GaAs thin layer 3B (having a typical thickness of 2 nm). In order to dope the GaAs thin layer 3B with Si by an atomic plane doping process, the Ga molecular beam is stopped by closing the shutter of the Ga effusion cell to suspend the GaAs growth, and the shutter of the Si effusion cell is opened to allow the Si molecular beam to impinge on the formed GaAs thin layer. The Si atoms adhere to the surface of the GaAs thin layer to form an Si atomic plane 10 at a sheet Si concentration Nsd of $1 \times 10^{12} - 4 \times 10^{12}$ cm$^{-2}$. Then, the shutter of the Si effusion shutter is closed and the shutter of the Ga effusion cell is reopened to restart the growth of the undoped GaAs thin layer 3B. Therefore, the GaAs thin layer 3B comprises the undoped GaAs layer, the Si atomic plane 10, and the undoped GaAs layer. It is possible to repeat the Si atomic plane doping process in the GaAs thin layer 3B, so that the donor impurity (Si) concentration is further increased. The atomic plane doping process is discussed in detail in an U.S. application of Shigehiko Sasa, Kazuhiko Kondo and Shunichi Muto, assigned to the same company, Fujitsu, which is based on Japanese Patent Application No. 60-33862 filed on Feb. 22, 1985. Then, the shutter of the Ga effusion cell is closed and the shutter of the Al effusion cell is opened to grow an undoped AlAs thin layer (having the same thickness as that of thin layer 3A) on the GaAs thin layer 3B.

In the obtained superlattice structure layer, since a high dopant concentration of the GaAs thin layer 3B of a GaAs well can be attained by using an atomic plane doping process, a concentration of electron being at a quantum level is larger than that of a superlattice structure proposed in the above-mentioned Bafa et al paper or Japanese Unexamined Patent Publication No. 60-28273. Thus, a sheet electron concentration of 2DEG layer of the obtained superlattice structure is also larger than that of the proposed structure.

Thereafter, the shutters of th Ga effusion cell and the Si effusion cell are opened. Thus all the shutters are opened to grow an Si-doped AlGaAs layer 4 having a thickness of, e.g., 40 nm, on the AlAs thin layer 3C. It is possible to make a molecular ratio (x) of AlAs to GaAs in the $Al_xGa_{1-x}As$ layer 4 to be 0.2, as shown in FIG. 2. The decrease of the molecular ratio from 0.3 to 0.2 means a decrease of the Al content in AlGaAs. Therefore, the resistance of the $Al_{0.2}Ga_{0.8}As$ layer is lower than that of a conventional $Al_{0.3}Ga_{0.7}As$ layer, and thus the source (or drain) contact resistance can be reduced. Furthermore, an n-type $Al_{0.2}Ga_{0.8}As$ layer has less amount of DX-center than an n-type $Al_{0.3}Ga_{0.7}As$, so that the use of the former layer as an electron supplying layer makes a HEMT more stable operation at 77K. The n-type AlGaAs layer 4 is uniformly doped with Si atoms to a dopant concentration Nd of, e.g., $1 \times 10^{18} - 2 \times 10^{18}$ cm$^{-3}$. Furthermore, as compared with the superlattice structure serving as an electron supply layer of Japanese Unexamined Patent Publication No. 60-28273, the doped $Al_{0.2}Ga_{0.8}As$ layer can make the electrode contact resistance decrease.

Next, the shutter of the Al effusion cell is closed to grow a Si-doped GaAs layer 5 (having a thickness of from 20 nm to 0.1 μm) on the Si-doped AlGaAs layer 4. The n-type GaAs layer 5 is also uniformly doped with Si atoms to a dopant concentration Nd of, e.g., $1 \times 10^{18} - 2 \times 10^{18}$ cm$^{-3}$.

After the formation of the GaAs layer 5, the obtained substrate with the MBE layers is taken out of the MBE apparatus.

A metal layer of AuGe/Au is formed on the GaAs layer 5 by a vacuum evaporation process and is patterned by a lithography process (e.g., a photoetching process) to form a source electrode 6 and a drain electrode 7. Then, a heat treatment for alloying is carried out to bring the source and drain electrodes into ohmic contact with the 2DEG layer. The GaAs layer 5 is selectively etched to expose a portion of the AlGaAs layer 4, and a gate electrode 8 of Ti/Pt/Au or Al is formed on the exposed surface of the AlGaAs layer 4. Thus, a field effect semiconductor is produced.

In the above-mentioned production process, the three superlattice structure layers 3 are formed in the following dimensions:

A. The undoped AlAs thin layers 3A and 3C have a thickness of 2.0 nm and the GaAs thin layer 3B with the Si atomic plane has a thickness of 2.0 nm. Therefore, a distance between the Si atomic plane 10 and the GaAs active layer 2 is 3.0 nm.

B. The undoped AlAs thin layers 3A and 3C have a thickness of 3.5 nm and the GaAs thin layer 3B with the Si atomic plane has a thickness of 2.0 nm. Therefore, the distance is 4.5 nm.

C. Each of the undoped AlAs thin layers 3A and 3C comprises an undoped 1.5 nm thick AlAs thin layer, an undoped 2.0 nm thick GaAs thin layer, and an undoped 1.5 nm thick AlAs thin layer. The GaAs thin layer 3B has a thickness of 2.0 nm. Therefore, the distance is 6.0 nm. As the result, there are three quantum wells in which the middle quantum well includes the Si atomic plane 10.

The sheet Si concentration Nsd of the Si atomic plane is $2 \times 10^{12}$ cm$^{-2}$.

Electric parameters (sheet electron concentration of 2DEG layer, electron mobility of 2DEG, and sheet resistivity of 2DEG layer) of the produced layer structure having the above-mentioned superlattice structure layers are measured by Hall measurement at 77K. The obtained results of the measurements are plotted as a function of the distance between GaAs active layer and Si atomic plane and are shown by solid lines in FIG. 3. For comparison, the electrical parameters of conventional GaAs/N-AlGaAs heterostructure layer structure with and without an undoped AlGaAs spacer layer having a thickness of 6.0 nm are plotted and are shown by broken lines in FIG. 3.

Figure 3:
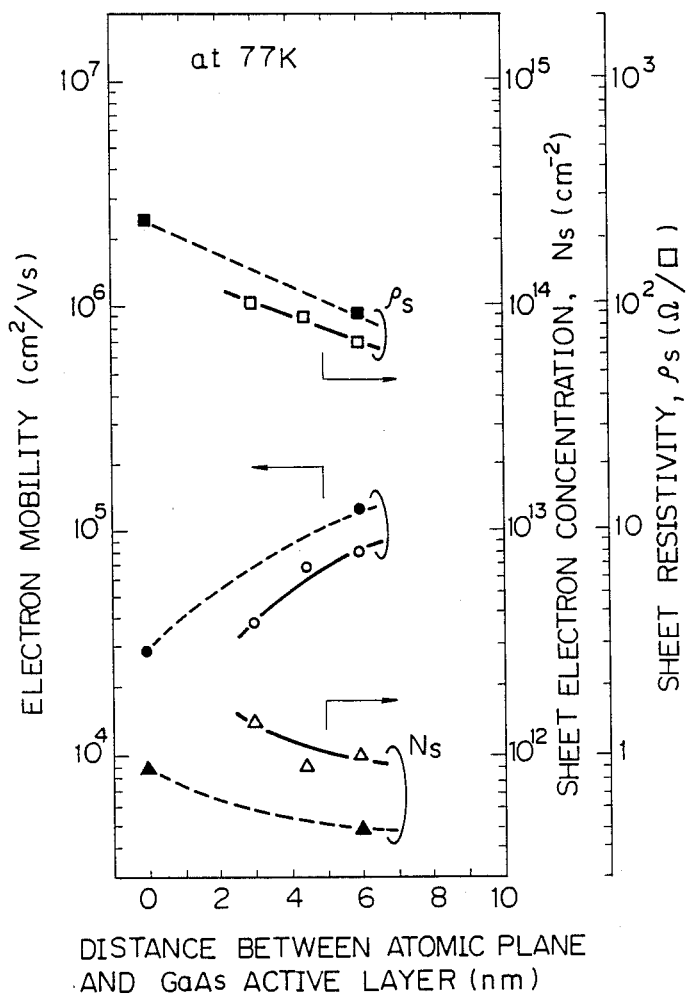
FIG. 3 is a diagram showing 2DEG mobility, sheet electron concentration, and sheet resistivity of the layer structure according to the present invention and a layer structure for a conventional HEMT, as a function of distance between the atomic plane (or n-type AlGaAs layer) and the GaAs active layer.

As can be seen from FIG. 3, a sheet electron concentration Ns of a 2DEG layer of the layer structure according to the present invention is higher than that of the conventional layer structure. At the distance of 6.0 nm, the sheet electron concentration Ns of 2DEG layer of the present invention is twice as high as that of the conventional device. When compared with the proposed prior art semiconductor device having a superlattice multilayer structure of undoped AlAs thin layer and GaAs thin layers uniformly doped with Si, the sheet electron concentration of the 2DEG layer of the semiconductor devices of the present invention is higher by 20% to 30%. The electron mobility of the 2DEG of the semiconductor devices of the present invention is lower than that of the conventional device at the distance of 6.0 nm. However, the sheet resistivity of the 2DEG layer decreases with the increasing distance between the Si atomic plane and the GaAs active layer, and reaches a minimum value of 71Ω/□ at the distance of 6.0 nm, which is almost 1.3 times lower than that of the conventional device with a 6.0 nm thick spacer. As a result, the transconductance $g_m$ can be increased and a larger electric current output can be obtained. Thus the charging or discharging of a load capacitance in a memory device can be carried out faster, when compared with a conventional case. In addition to the above advantages, when the molecular ratio (x) of AlAs in the doped $Al_xGa_{1-x}As$ layer is decreased to 0.2, in the semiconductor device according to the present invention, a persistent photoconductivity at low temperatures is reduced and the source and drain contact resistances are lower.

It will be obvious that the present invention is not restricted to the above-mentioned embodiments and that many variations are possible for persons skilled in the art without departing from the scope of the invention. For example, the present invention is not restricted to the material combination of GaAs, AlGaAs, and AlAs. The another combination can be InP substrate 1, an i-type $In_xGa_{1-x}As$ (x≈0.53) active layer 2, i-type $In_xAl_{1-x}As$ (x≈0.53) thin layers 3A and 3C, $In_x$-

Ga$_{1-x}$As (x≈0.53) atomic plane doped thin well layer 3B, and In$_x$(Al$_{0.5}$Ga$_{0.5}$)$_{1-x}$As (x≈0.53) surface layer 4. Furthermore, it is possible to form the superlattice structure layer 3 of i-type AlAs thin barrier layers and i-type GaAs thin well layers which are alternately grown to form a multiquantum well structure. In this case, at least one of the GaAs thin well layers incorporates at least one dopant atomic plane. It is unnecessary to form the doped AlGaAs layer 4, since the multiquantum well structure serves as an AlGaAs electron supply layer.

We claim:

1. A field effect semiconductor device in which a two-dimensional electron gas is utilized comprising:
   a semi-insulating GaAs substrate;
   an intrinsic-type GaAs active layer formed on said substrate;
   a superlattice structure layer comprising:
      a first intrinsic-type AlAs thin layer formed on said active layer;
      a GaAs thin well layer formed on said first intrinsic-type AlAs thin layer and including:
         a first undoped GaAs layer formed on said first intrinsic-type AlAs thin layer;
         a second undoped GaAs layer; and
         an atomic plane of dopant atoms formed between said first and said second undoped GaAs layers;
      a second intrinsic-type AlAs thin layer formed on said GaAs thin well layer, forming a quantum well;
   a doped AlGaAs layer formed on said superlattice structure layer; and
   electrodes for source drain and gate formed on said quantum well.

2. A semiconductor device according to claim 1, wherein said superlattice structure layer further comprises a multi-quantum well structure in which intrinsic-type AlGa thin layers and GaAs thin well layers are alternately formed, and wherein at least one of said well layers is doped with an atomic plane of dopant atoms.

3. A field effect semiconductor device in which is a two-dimensional electron gas is utilized comprising:
   a semi-insulating GaAs substrate;
   an intrinsic-type GaAs active layer formed on. said substrate;
   a superlattice structure layer comprising:
      a first intrinsic-type AlAs thin layer formed on said active layer;
      a GaAs thin well layer formed on said first AlAs thin layer and including:
         a first undoped GaAs layer formed on said first intrinsic-type thin layer;
         a second undoped GaAs layer; and
         an atomic plane of dopant atoms formed between said first and said second undoped GaAs layers; and
      a second intrinsic-type AlAs thin layer formed on said doped GaAs thin layer, forming a GaAs quantum well;
      an n-type Al$_x$Ga$_{1-x}$As layer formed on said superlattice structure layer, where x is 0.2;
   electrodes for source, drain and gate formed over said n-type Al$_x$Ga$_{1-x}$As layer.

4. A field effect semiconductor device in which a two-dimensional electron gas is utilized, comprising:
   a semi-insulating InP substrate;
   an intrinsic-type InGaAs active layer formed on said substrate;
   a superlattice structure layer comprising:
      a first intrinsic-type InAlAs thin layer formed on said active layer;
      a InGaAs thin well layer formed on said first intrinsic-type InAlAs thin layer and including:
         a first undoped InGasAs layer formed on said first intrinsic-type InGaAs thin layer;
         a second undoped InGaAs layer; and
         an atomic plane of dopant atoms formed between said first and said second undoped InGasAs layers;
      a second intrinsic-type InAlAs thin layer formed on said InGasAs thin well layer, forming a quantum well;
   a doped INAlGaAs layer formed on said superlattice structure layer; and
   electrodes for source, drain and gate formed over said quantum well.

5. A semiconductor device according to claim 4, wherein said superlattice structure layer further comprises a multi-quantum well structure in which intrinsic-type INAlAs thin layers and InGasAs thin well layers are alternately formed, and wherein at least one of said thin well layers is doped with an atomic plane of dopant atoms.

* * * * *

UNITED STATES PATENT AND TRADEMARK OFFICE
CERTIFICATE OF CORRECTION

PATENT NO. : 4,833,508
DATED : May 23, 1989
INVENTOR(S) : Tomonori Ishikawa

It is certified that error appears in the above-identified patent and that said Letters Patent is hereby corrected as shown below:

Column 1, line 43, after "T. Mimura and" insert --T. Ishikawa, "Invited) MBE-Grown GaAs/N-AlCaAs Hetero- --.

Column 7, line 35, "on" should be --over--, line 41, after "said" insert --thin--.

Signed and Sealed this

Twenty-seventh Day of February, 1990

Attest:

JEFFREY M. SAMUELS

*Attesting Officer*     *Acting Commissioner of Patents and Trademarks*